United States Patent
Yu et al.

(10) Patent No.: US 12,142,657 B2
(45) Date of Patent: Nov. 12, 2024

(54) GATE STRUCTURE FOR MULTI-GATE DEVICE AND RELATED METHODS

(71) Applicant: Taiwan Semiconductor Manufacturing Company, Ltd., Hsinchu (TW)

(72) Inventors: Kuo-Feng Yu, Hsinchu County (TW); Jiao-Hao Chen, Hsinchu (TW); Chih-Yu Hsu, Hsinchu County (TW); Chih-Wei Lee, Hsinchu (TW); Chien-Yuan Chen, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 391 days.

(21) Appl. No.: 17/659,133

(22) Filed: Apr. 13, 2022

(65) Prior Publication Data
US 2023/0012454 A1    Jan. 12, 2023

Related U.S. Application Data

(60) Provisional application No. 63/220,383, filed on Jul. 9, 2021.

(51) Int. Cl.
| | |
|---|---|
| *H01L 29/423* | (2006.01) |
| *H01L 21/02* | (2006.01) |
| *H01L 29/06* | (2006.01) |
| *H01L 29/40* | (2006.01) |
| *H01L 29/66* | (2006.01) |
| *H01L 29/786* | (2006.01) |

(52) U.S. Cl.
CPC .... *H01L 29/42392* (2013.01); *H01L 21/0259* (2013.01); *H01L 29/0665* (2013.01); *H01L 29/401* (2013.01); *H01L 29/66742* (2013.01); *H01L 29/78696* (2013.01); *H01L 2029/42388* (2013.01)

(58) Field of Classification Search
None
See application file for complete search history.

(56) References Cited

U.S. PATENT DOCUMENTS

| | | | |
|---|---|---|---|
| 9,397,159 B2 | 7/2016 | Ching et al. | |
| 9,741,810 B2 | 8/2017 | Ching et al. | |
| 9,786,774 B2 | 10/2017 | Colinge et al. | |
| 10,804,162 B2 | 10/2020 | Wang et al. | |
| 11,031,397 B2 | 6/2021 | Liaw | |
| 11,114,529 B2 | 9/2021 | Chiang et al. | |
| 11,127,819 B2 | 9/2021 | Liaw | |

*Primary Examiner* — Anthony Ho
(74) *Attorney, Agent, or Firm* — Haynes and Boone, LLP

(57) ABSTRACT

A semiconductor device and related method for forming a gate structure. In some embodiments, a semiconductor device includes a fin extending from a substrate. In some cases, the fin includes a plurality of semiconductor channel layers. In some examples, the semiconductor device further includes a gate dielectric surrounding each of the plurality of semiconductor channel layers. In some embodiments, a first thickness of the gate dielectric disposed on a top surface of a topmost semiconductor channel layer of the plurality of semiconductor channel layers is greater than a second thickness of the gate dielectric disposed on a surface of another semiconductor channel layer disposed beneath the topmost semiconductor channel layer.

20 Claims, 11 Drawing Sheets

GATE STRUCTURE FOR MULTI-GATE DEVICE AND RELATED METHODS

CROSS-REFERENCE TO RELATED APPLICATION

This application claims the benefit of U.S. Provisional Application No. 63/220,383, filed Jul. 9, 2021, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all-around (GAA) transistor. GAA transistors get their name from the gate structure which extends completely around the channel, providing excellent electrostatic control of the channel. GAA transistors also provide high drive currents and are compatible with conventional complementary metal-oxide-semiconductor (CMOS) processes. Further, their three-dimensional structure allows them to be aggressively scaled while maintaining gate control and mitigating SCEs.

However, despite having many desirable features, GAA transistor fabrication has continued to face challenges as a result of the ongoing scaling down of semiconductor IC dimensions. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
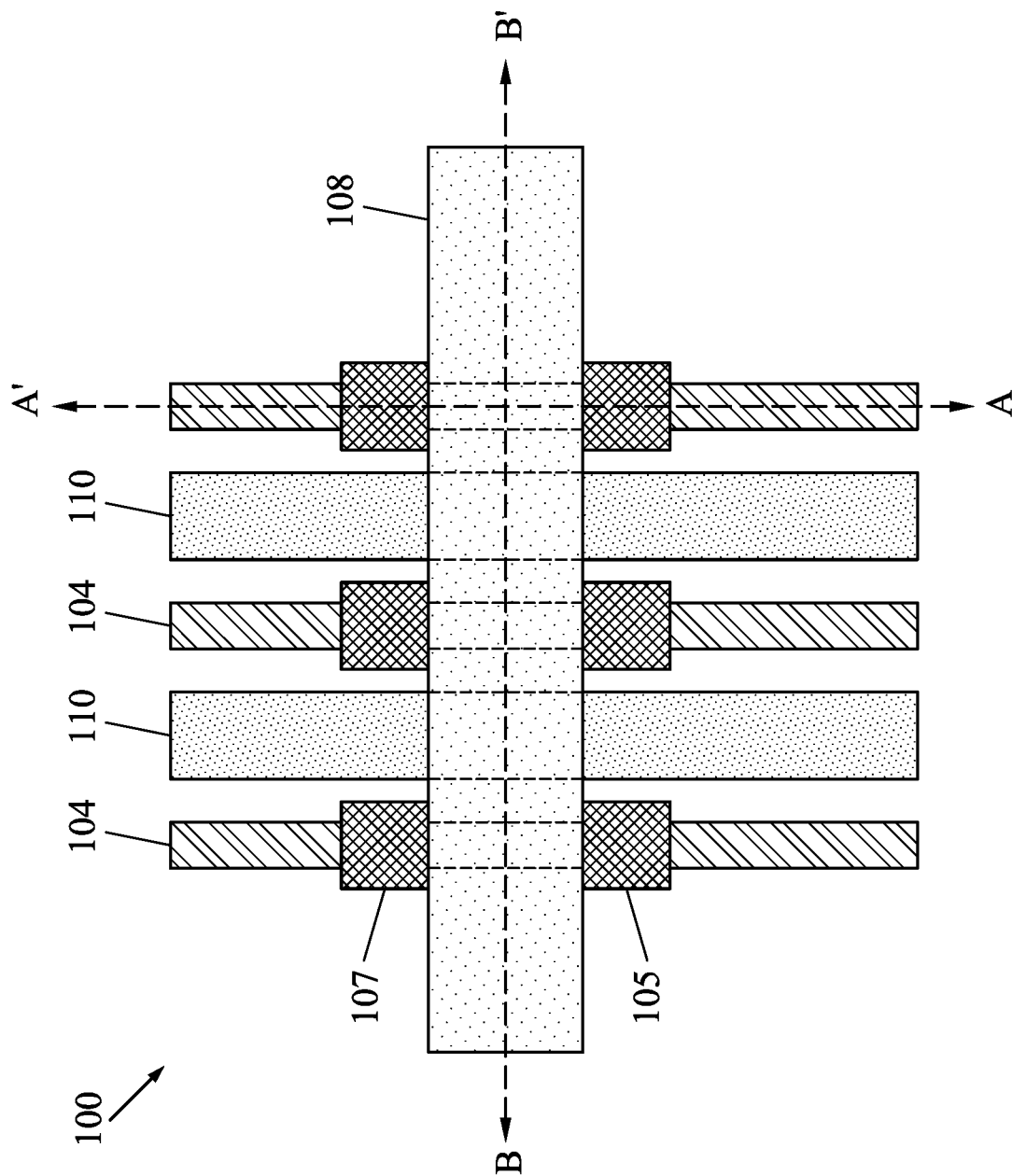
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additionally, in the discussion that follows, dimensions (e.g., such as thickness, width, length, etc.) for a given layer or other feature may at times be described using terms such as "substantially equal", "equal", or "about", where such terms are understood to mean within +/−10% of the recited value or between compared values. For instance, if dimension A is described as being "substantially equal" to dimension B, it will be understood that dimension A is within +/−10% of dimension B. As another example, if a layer is described as having a thickness of about 100 nm, it will be understood that the thickness of the layer may in a range between 90-110 nm.

It is also noted that the present disclosure presents embodiments in the form of multi-gate transistors, including methods of gate stack formation for such transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

A transistor gate structure generally includes a gate dielectric and a metal electrode formed over the gate dielectric. In various examples, the gate dielectric may include an interfacial layer (IL) and a high-K gate dielectric formed over the IL. For a GAA transistor, the gate dielectric may be formed wrapping around each semiconductor channel layer of a plurality of semiconductor channel layers that define a plurality of channel regions for the GAA transistor. In at least some existing GAA transistor implementations, a thickness of the gate dielectric may be substantially the same over each semiconductor channel layer. In some cases, after formation of the gate dielectric and as part of subsequent device processing, an etching process and/or a clean process (e.g., a wet clean process) may be performed. As a result, the gate dielectric formed on a topmost semiconductor channel layer of the GAA device may be damaged by the etching process and/or the clean process. This damage may occur because the topmost semiconductor channel layer is most directly exposed to the etching process and/or the clean process. In at least some examples, the topmost semiconductor channel layer itself may be damaged in a region below the gate dielectric damage. In various cases, and because of this damage, leakage current may increase, and device performance will be degraded.

Embodiments of the present disclosure offer advantages over the existing art, though it is understood that other embodiments may offer different advantages, not all advantages are necessarily discussed herein, and no particular advantage is required for all embodiments. For example, embodiments discussed herein include gate structures for multi-gate devices (e.g., such as GAA transistors) and methods of forming such gate structures. In various embodiments, the gate dielectric formed over the topmost semiconductor channel layer of the plurality of channel layers may be thicker than the gate dielectric formed over one or more other semiconductor channel layers disposed beneath the topmost semiconductor channel layer. In some examples, the thicker gate dielectric may also be formed over at least one semiconductor channel layer disposed beneath the topmost semiconductor channel layer. Generally, and in various embodiments, the thicker gate dielectric (e.g., IL and high-K gate dielectric) may be deposited (e.g., using a thermal ALD process) to provide a thicker gate dielectric along a top surface, a lateral/side surface, a bottom surface, or a combination thereof, of the topmost semiconductor channel layer and optionally over at least one semiconductor channel layer disposed beneath the topmost semiconductor channel layer. In some cases, the gate dielectric may be deposited using one or more deposition processes. In various embodiments, deposition of the thicker gate dielectric on the topmost semiconductor channel layer can protect the topmost semiconductor channel layer from potential damage due to a subsequent etching process and/or clean process, thereby preventing increased leakage current and degraded device performance. In some examples, the reduction in defects afforded by the thicker gate dielectric on the topmost semiconductor channel layer may be readily confirmed by inspection (e.g., using an E-beam inspection scan). In various cases, the thicker gate dielectric on the topmost semiconductor channel layer may also serve to reduce AC delay by lowering the gate-to-channel capacitance (Cgc). Further, the thicker gate dielectric on the topmost semiconductor channel layer may be deposited without added process complexity. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 and hybrid fins 110, a gate structure 108 disposed over and around the fin elements 104 and the hybrid fins 110, and source/drain features 105, 107 formed in source/drain regions adjacent to and on either side of the gate structure 108, where the source/drain features 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
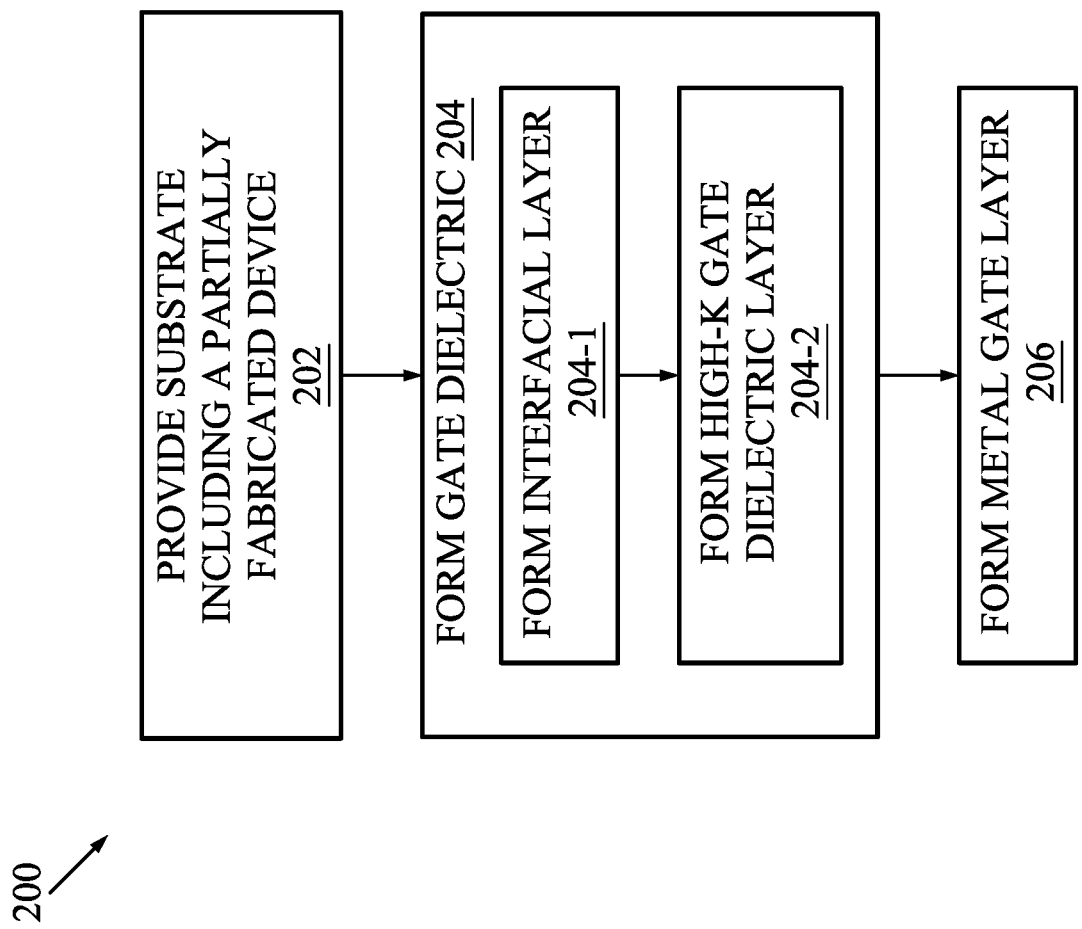
FIG. 2 is a flow chart of a method of fabrication of a multi-gate device, in accordance with some embodiments.

Referring to FIG. 2, illustrated therein is a method 200 of semiconductor fabrication including fabrication of a semiconductor device 300 (e.g., which includes a multi-gate device), in accordance with various embodiments. The method 200 is discussed below with reference to fabrication of GAA transistors. However, it will be understood that aspects of the method 200 may be equally applied to other types of multi-gate devices, or to other types of devices implemented by the multi-gate devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is further noted that, in some embodiments, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 include a plurality of semiconductor devices (e.g., transistors) which may be interconnected. Moreover, it is noted that the process steps of method 200, including any descriptions given with reference to the figures are merely exemplary and are not intended to be limiting beyond what is specifically recited in the claims that follow.

The method 200 begins at block 202 where a substrate including a partially fabricated device is provided. Referring to the example of FIG. 3, in an embodiment of block 202, a partially fabricated device 300 is provided. FIGS. 3, 4, 5, and 6 provide cross-sectional views of an embodiment of the semiconductor device 300 along a plane substantially parallel to a plane defined by section BB' of FIG. 1 (e.g., along the direction of the gate structure 108).

The device 300 is formed on a substrate 302 and includes fins 304 and hybrid fins 306. By way of example, the fins 304 may include the fin elements 104, and the hybrid fins 306 may include the hybrid fins 110, discussed above. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

In some embodiments, the fins 304, which extend from the substrate 302, may be formed prior to the hybrid fins 306. In some examples, the fins 304 may include a substrate portion 302A (formed from the substrate 302) and a plurality of epitaxial layers 312, where the epitaxial layers 312 include semiconductor channel layers. In an embodiment, the epitaxial layers 312 include silicon (Si). In various embodiments, the epitaxial layers 312 may form a channel region of a GAA transistor, the channel region disposed between respective source/drain regions of the device 300. As noted above, the epitaxial layers 312 may be referred to as semiconductor channel layers that are used to form a channel region of a GAA transistor. In various embodiments, the semiconductor channel layers (e.g., the epitaxial layers 312 or portions thereof) may include nanosheet channel(s), nanowire channel(s), bar-shaped channel(s), and/or other suitable channel configurations. The semiconductor channel layers may also be used to form portions of the source/drain features of the GAA transistor, in some embodiments.

It is noted that while the fins 304 are illustrated as including three (3) layers of the epitaxial layer 312, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some embodiments, the number of epitaxial layers 312, and thus the number of semiconductor channel layers, is between 3 and 10. In some embodiments, the epitaxial layers 312 (the semiconductor channel layers) each have a thickness 'T' in a range of about 5-15 nm and a spacing 'S' between adjacent epitaxial layers 312 (semiconductor channel layers) is in a range of about 5-15 nm. As noted above, the epitaxial layers 312 may serve as channel region(s) for a subsequently formed multi-gate device (e.g., a GAA transistor) and its thickness, and spacing between adjacent epitaxial layers 312, may be chosen based at least in part on device performance considerations.

In various embodiments, the fins 304 and their respective semiconductor channel layers (the epitaxial layer 312) may be formed by first growing an epitaxial layer stack of layers of a first composition interposed by layers of a second composition. The layers of the first composition may include the semiconductor channel layers (the epitaxial layer 312, which may include Si), and the layers of the second composition may include dummy layers (e.g., such as SiGe dummy layers). In some embodiments, epitaxial growth of the epitaxial layers stack is achieved by a molecular beam epitaxy (MBE) process, a chemical vapor deposition (CVD) process, a metalorganic chemical vapor deposition (MOCVD) process, other suitable epitaxial growth process, or combinations thereof.

After forming the epitaxial layers of the first composition (the epitaxial layer 312, which may include Si) and the epitaxial layers of the second composition (e.g., such as SiGe dummy layers), a hard mask (HM) layer may be formed over the device 300. In some embodiments, the HM layer includes an oxide layer (e.g., a pad oxide layer that may include $SiO_2$) and nitride layer (e.g., a pad nitride layer that may include $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique. Generally, in some embodiments, the HM layer may include a nitride-containing material deposited by CVD, ALD, PVD, or other suitable process.

After forming the HM layer, fins may be formed using suitable processes including photolithography and etch processes. The photolithography process may include forming a photoresist layer over the device 300, exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 302, and layers formed thereupon, while an etch process forms trenches in unprotected regions through the HM layer, through the epitaxial layers of the first composition and the second composition, and into the substrate 302, thereby leaving a plurality of extending fins each including a substrate portion, portions of the epitaxial layers of the first composition and the second composition, and portions of the HM layer. The trenches may be etched using a dry etch (e.g., reactive ion etching), a wet etch, and/or other suitable processes. In some embodiments, the HM layer may be removed (e.g., by a CMP process) after formation of the fins. However, in at least some cases, the HM layer may be removed prior to formation of the fins.

Figure 3:
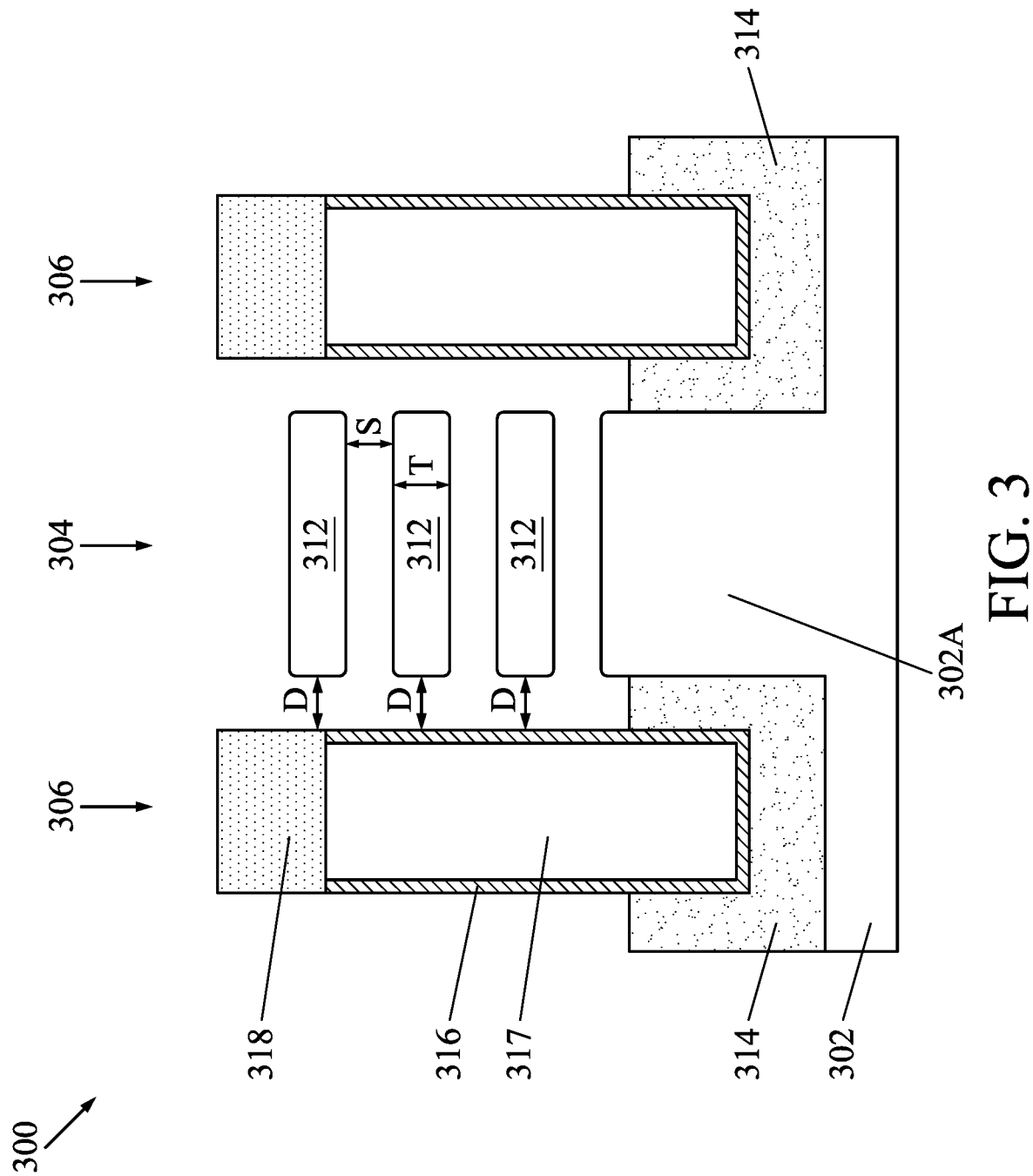
FIGS. 3, 4, 5, and 6 provide cross-sectional views of an embodiment of a semiconductor device along a plane substantially parallel to a plane defined by section BB' of FIG. 1, at different stages of processing according to the method of FIG. 2, in accordance with some embodiments.

During subsequent processing, a channel layer release process may be performed, where the dummy layers (e.g., SiGe dummy layers) in the channel regions of the device 300 may be selectively removed (e.g., using a selective etching process), while the semiconductor channel layers (the epitaxial layers 312) remain substantially unetched to provide the fins 304 as shown in FIG. 3. In some examples, selective removal of the dummy layers (e.g., the SiGe dummy layers) may be referred to as a channel layer release process (e.g., as the semiconductor channel layers are released from the dummy layers). In some embodiments, the selective etching process may include a selective wet etching process. In some cases, the selective wet etching includes ammonia and/or ozone. As merely one example, the selective wet etching process includes tetra-methyl ammonium hydroxide (TMAH). In some embodiments, the selective etching process may include a dry, plasma-free etching process performed using a CERTAS® Gas Chemical Etch System, available from Tokyo Electron Limited, Tokyo, Japan.

It is noted that as a result of the selective removal of the dummy layers (the SiGe dummy layers), gaps are formed between the adjacent semiconductor channel layers (the epitaxial layers 312) in the channel region of the device 300.

By way of example, the gaps may serve to expose surfaces of the epitaxial layers 312, upon which one or more layers of a gate structure will be formed. For instance, as described in more detail below, portions of gate structures (e.g., including a metal gate stack having an interfacial layer, a high-K dielectric layer, and one or more metal electrode layers) will be formed within the gaps between adjacent semiconductor channel layers (the epitaxial layers 312). In some embodiments, after removing the dummy layers (the SiGe dummy layers), and prior to forming the portions of the gate structures, a sheet trim process (e.g., an etching process) may be performed to modify a profile of the semiconductor channel layers (e.g., the epitaxial layers 312) to achieve desired dimensions and/or desired shapes (e.g., cylindrical-shaped (e.g., nanowire), rectangular-shaped (e.g., nanobar), sheet-shaped (e.g., nanosheet), etc.) of the semiconductor channel layers.

After forming the fins as described above, but prior to the channel release process, the trenches interposing the fins may be filled with a dielectric material to form shallow trench isolation (STI) features interposing the fins, where the STI features are subsequently recessed (e.g., after formation of the hybrid fins 306) to form the STI features 314. In some embodiments, the dielectric layer used to fill the trenches may include $SiO_2$, silicon nitride, silicon oxynitride, fluorine-doped silicate glass (FSG), a low-K dielectric, combinations thereof, and/or other suitable materials known in the art. In various examples, the dielectric layer may be deposited by a CVD process, a subatmospheric CVD (SACVD) process, a flowable CVD process, an ALD process, a PVD process, and/or other suitable process.

In some embodiments, the STI features interposing the fins may be patterned (e.g., using a photolithography and etching process) to form trenches within the STI features and within which the hybrid fins 306 will be formed. Alternatively, the dielectric material used to form the STI features may be deposited conformally over the fins, such that the conformal deposition itself forms trenches within the STI features and between adjacent fins. Regardless of how they are formed, a dielectric layer 316 may be deposited conformally in the trenches formed within the STI features. Thereafter, a dielectric layer 317 may be deposited over the dielectric layer 316. Generally, and in some embodiments, the dielectric layers 316, 317 may include SiN, SiCN, SiOC, SiOCN, SiOx, or other appropriate material. In some examples, the dielectric layer 316 may include a low-K dielectric layer, and the dielectric layer 317 may include a flowable oxide layer. In various cases, the dielectric layers 316, 317 may be deposited by a CVD process, an ALD process, a PVD process, a spin-coating and baking process, and/or other suitable process. In some examples, after depositing the dielectric layers 316, 317, a CMP process may be performed to remove excess material portions and to planarize a top surface of the device 300.

In some embodiments, a recessing process may be performed to remove top portions of the dielectric layers 316 and 317. In some embodiments, the recessing process may include a dry etching process, a wet etching process, and/or a combination thereof. After performing the recessing process, a high-K dielectric layer 318 may be deposited over the recessed dielectric layers 316, 317 to provide the hybrid fins 306. In some embodiments, the high-K dielectric layer 318 may include $HfO_2$, $ZrO_2$, HfAlOx, HfSiOx, $Y_2O_3$, $Al_2O_3$, or another high-K material. The high-K dielectric layer 318 may be deposited by a CVD process, an ALD process, a PVD process, and/or other suitable process. After deposition of the high-K dielectric layer 318, a CMP process is performed to remove excess material portions and to planarize a top surface of the device 300. Thus, in various cases, the hybrid fins 306 may be defined as having a lower portion including the recessed portions of the dielectric layers 316, 317 and an upper portion including the high-K dielectric layer 318. In some cases, the hybrid fins 306 may be alternatively described as a bi-layer dielectric having a high-K upper portion and a low-K lower portion. In some examples, a height ratio of the upper portion to the lower portion may be about 1/20-20/1. In some embodiments, the hybrid fins 306 may be used to effectively prevent the undesirable lateral merging of the source/drain epi-layers formed on adjacent fins during subsequent processing.

After forming the hybrid fins 306, the STI features may be recessed to provide the STI features 314. As shown in the example of FIG. 3, the STI features 314 are recessed such that the fins 304 and the hybrid fins 306 extend above the STI features 314. In some embodiments, the recessing process may include a dry etching process, a wet etching process, and/or a combination thereof. In some embodiments, the recessing of the STI features 314 also serves to expose each of the epitaxial layers (e.g., such as the epitaxial layers 312) of the fins 304. Stated another way, the recessing of the STI features 314 exposes the epitaxial layers of the first composition (epitaxial layers 312) and the second composition (dummy layers), after which the channel release process is performed to provide the exposed fins 304.

As previously discussed, for multi-gate transistors (e.g., GAA transistors) fabricated in accordance with the various embodiments described herein, the gate dielectric formed over the topmost semiconductor channel layer of the plurality of channel layers may be thicker than the gate dielectric formed over one or more other semiconductor channel layers disposed beneath the topmost semiconductor channel layer. To accomplish this, and in some embodiments, a distance 'D' between lateral ends of the epitaxial layers 312 (semiconductor channel layers) and an adjacent hybrid fin 306 is a critical parameter and should be carefully selected. As described in more detail below, an appropriate distance 'D' will define a narrow path through which a high-K gate dielectric precursor flows in order to be deposited over semiconductor channel layers disposed beneath the topmost semiconductor channel layer. Stated another way, the high-K gate dielectric precursor has a shorter, more direct path to reach the topmost semiconductor channel layer, which effectively provides more deposition time and a thicker high-K gate dielectric layer for the topmost semiconductor layer. On the other hand, the high-K gate dielectric precursor has a longer, more indirect path to reach the semiconductor channel layers disposed beneath the topmost semiconductor channel layer, which effectively provides less deposition time and a thinner high-K gate dielectric layer than that deposited over the topmost semiconductor layer. In some embodiments, this phenomenon may be described as a "shadowing effect". Generally, and in various embodiments, the shadowing effect may occur when the distance 'D' is less than or equal to about 20 nm. Moreover, the magnitude of the shadowing effect may vary as a function of the distance 'D', as described below.

The method 200 proceeds to block 204 where a gate dielectric is formed. In various examples, formation of the gate dielectric (block 204) may include formation of an interfacial layer (IL) (block 204-1) followed by formation of a high-K gate dielectric layer (block 204-2). Referring to the example of FIGS. 3 and 4, in an embodiment of block 204-1, an IL 402 is formed on exposed surfaces of the epitaxial layers 312 (semiconductor channel layers) and the substrate portion 302A, including wrapping around (surrounding) the epitaxial layers 312 within the channel region of the device 300. In some embodiments, the IL 402 may include a dielectric material such as silicon oxide ($SiO_2$), HfSiO, or silicon oxynitride (SiON), and the IL 402 may be formed by thermal oxidation, ALD, PVD, pulsed laser deposition (PLD), CVD, and/or other suitable methods. In some cases, formation of the IL 402 may not be subject to the shadowing effect. As a result, and in some embodiments, the thickness the IL 402 may be substantially the same over each of the semiconductor channel layers of the device 300. To be sure, in at least some examples, formation of the IL 402 may be subject to the shadowing effect such that the IL 402 formed over the topmost semiconductor channel layer of the plurality of channel layers is thicker than the IL 402 formed over one or more other semiconductor channel layers disposed beneath the topmost semiconductor channel layer. However, for purposes of the discussion that follows, it is assumed that the IL 402 is not subject to the shadowing effect.

Figure 4:
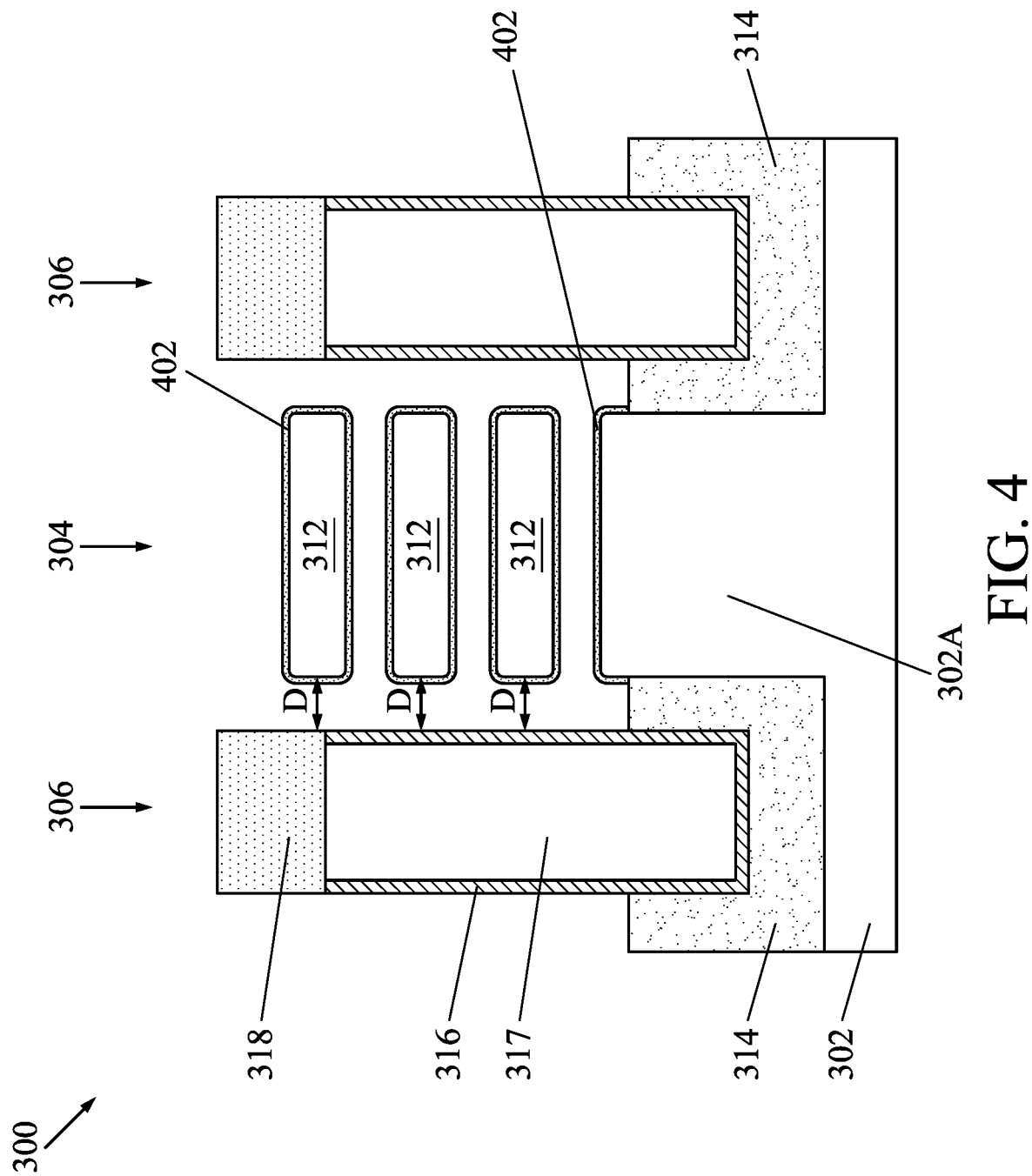
Figure 5:
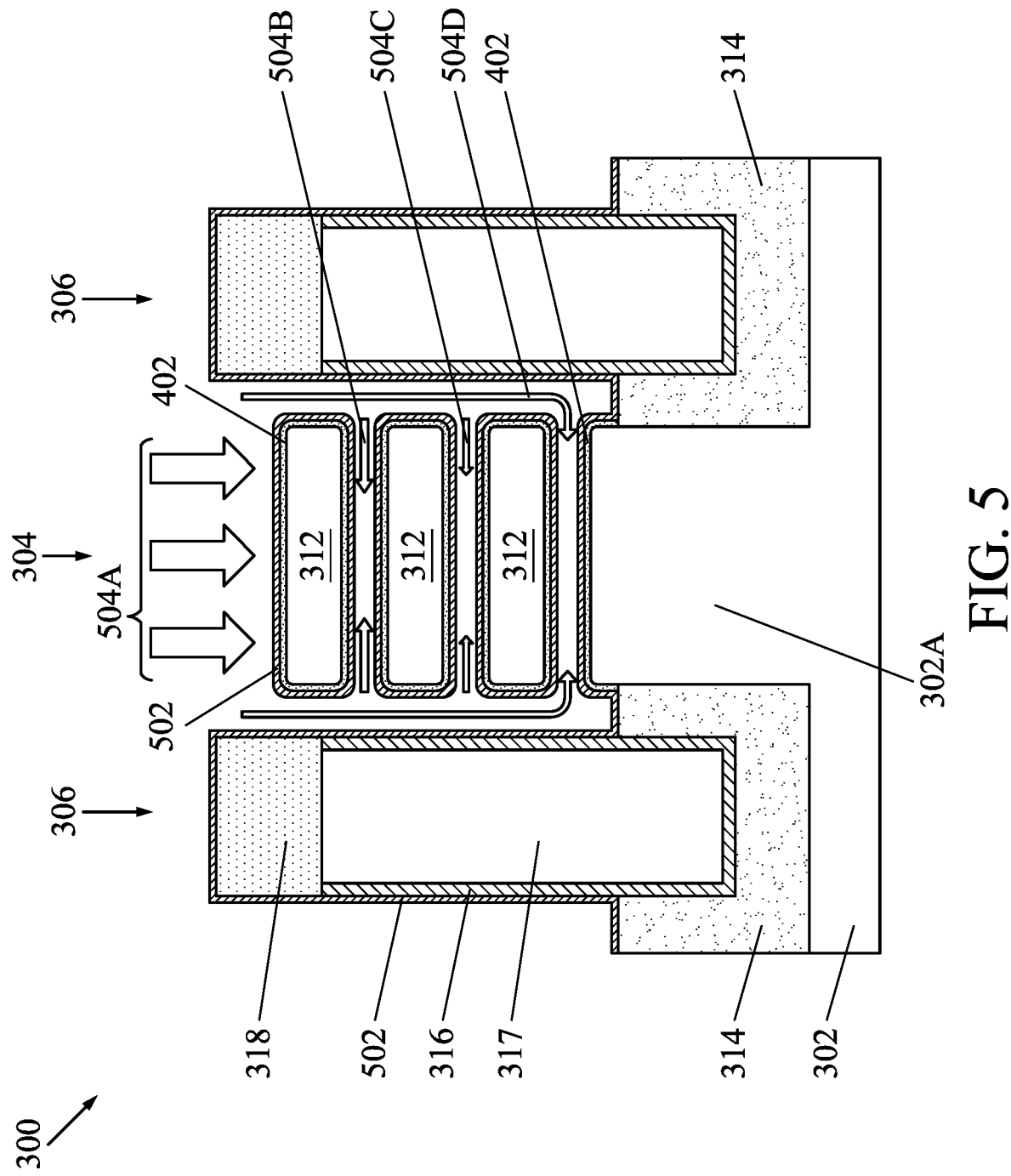

With reference to the example of FIGS. 4 and 5, in an embodiment of block 204-2, a high-K gate dielectric layer 502 is formed over the IL 402, including wrapping around (surrounding) the IL 402 formed on surfaces of the epitaxial layers 312, as well as over portions of a top surface of the STI features 314, and along sidewalls and a top surface of the hybrid fins 306. High-K gate dielectrics, as used and described herein, include dielectric materials having a high dielectric constant, for example, greater than that of thermal silicon oxide (~3.9). In various embodiments, the IL 402 and the high-K gate dielectric layer 502 collectively define a gate dielectric of the gate structure for the device 300. In some examples, the high-K gate dielectric layer 502 may include hafnium oxide ($HfO_2$). Alternatively, the high-K gate dielectric layer 502 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $La_2O_3$, $Si_3N_4$, oxynitrides (SiON), combinations thereof, or other suitable material. In various embodiments, the high-K gate dielectric layer 502 may be formed by ALD, PVD, PLD, CVD, and/or other suitable methods.

Still referring to FIG. 5, illustrated therein is schematic representation of flows 504A, 504B, 504C, 504D of a precursor used for ALD-deposition of the high-K gate dielectric layer 502 over the IL 402 on surfaces of each of the epitaxial layers 312. As one example, hafnium tetrachloride ($HfCl_4$) may be used as a hafnium precursor when the high-K gate dielectric layer 502 includes $HfO_2$. Alternatively, in some embodiments, tetrakis(ethylmethylamino) hafnium (TEMAH) may be used as the hafnium precursor when the high-K gate dielectric layer 502 includes $HfO_2$. In various cases, and as part of the ALD deposition process, alternating pulses of an oxidizer (e.g., such as $H_2O$ or $O_3$) and the hafnium precursor may be introduced into a process chamber housing the device 300 in order to deposit the high-K gate dielectric layer 502. While some examples of precursors and oxidizers used to deposit the high-K gate dielectric layer 502 have been provided, these examples are merely illustrative and not meant to be limiting in any way. For example, it will be understood that when the high-K gate dielectric layer 502 includes a different high-K dielectric material, such as one listed above, then other appropriate precursors and oxidizers may be used to deposit the high-K gate dielectric layer 502.

The size variation of the arrows that is used to represent each of the precursor flows 504A, 504B, 504C, 504D is provided to qualitatively represent an amount, from highest (504A) to lowest (504D), of a high-K material precursor (e.g., such as $HfCl_4$) arriving at a given surface of each of the epitaxial layers 312. Stated another way, the schematic representation of the precursor flows 504A, 504B, 504C, 504D is provided to generally illustrate the shadowing effect. As a result of the shadowing effect, and in accordance with the embodiments disclosed herein, the high-K gate dielectric layer 502 formed over the topmost semiconductor channel layer (topmost epitaxial layer 312) of the plurality of channel layers may be thicker than the high-K gate dielectric layer 502 formed over one or more other semiconductor channel layers (epitaxial layers 312) disposed beneath the topmost semiconductor channel layer. As described above, the distance 'D' between the lateral ends of the epitaxial layers 312 and the adjacent hybrid fin 306 defines a narrow path through which the high-K gate dielectric precursor (e.g., such as $HfCl_4$) flows in order to be deposited over each of the epitaxial layers 312 disposed beneath the topmost epitaxial layer 312 (topmost semiconductor channel layer). As shown by the precursor flow 504A, the high-K gate dielectric precursor has the shortest, most direct path to reach top and side surfaces of the topmost epitaxial layer 312, which effectively provides more deposition time and a thicker high-K gate dielectric layer 502 for the topmost epitaxial layer 312. For the precursor flow 504B, the high-K gate dielectric precursor travels through the narrow path between the topmost epitaxial layer 312 and the hybrid fin 306, which is a longer and more indirect path than the precursor flow 504A, which effectively provides less deposition time and a thinner high-K gate dielectric layer 502 than that deposited by the precursor flow 504A. For the precursor flow 504C, the high-K gate dielectric precursor travels through the narrow path between the topmost epitaxial layer 312 and the hybrid fin 306, as well as through the narrow path between the middle epitaxial layer 312 and the hybrid fin 306, which is an even longer and more indirect path than the precursor flow 504B, which effectively provides less deposition time and a thinner high-K gate dielectric layer 502 than that deposited by the precursor flows 504A and 504B. For the precursor flow 504D, the high-K gate dielectric precursor travels through the narrow path between the topmost epitaxial layer 312 and the hybrid fin 306, the narrow path between the middle epitaxial layer 312 and the hybrid fin 306, and the narrow path between the bottommost epitaxial layer 312 and the hybrid fin 306, which is a longer and more indirect path than the precursor flow 504C, which effectively provides less deposition time and a thinner high-K gate dielectric layer 502 than that deposited by the precursor flows 504A, 504B, and 504C.

While FIG. 5 illustrates the high-K gate dielectric layer 502 formed over each of the epitaxial layers 312 as appearing to be of substantially the same thickness, it will be understood that because of the shadowing effect, as discussed above, the thickness of the high-K gate dielectric layer 502 formed over one or more surfaces of each of the epitaxial layers 312 is different. For example, in various embodiments, the high-K gate dielectric layer 502 formed over one or more surfaces of the topmost epitaxial layer 312 may be thicker than the high-K gate dielectric layer 502 formed over one or more surfaces of the middle epitaxial layer 312, and the high-K gate dielectric layer 502 formed over one or more surfaces of the middle epitaxial layer 312 may be thicker than the high-K gate dielectric layer 502 formed over one or more surfaces of the bottommost epitaxial layer 312.

To more clearly illustrate the differences in thickness of the high-K gate dielectric layer 502 formed over each of the epitaxial layers 312, reference is made to FIGS. 7-10, which provide zoomed-in views of various embodiments of the topmost, middle, and bottommost epitaxial layers 312 of the fin 304 of FIG. 5. As previously noted, the shadowing effect may occur when the distance 'D' is less than or equal to about 20 nm, and the magnitude of the shadowing effect may vary as a function of the distance 'D'. With that in mind, FIGS. 7-10 provide examples of the thickness of the high-K gate dielectric layer 502 (and more generally the total gate dielectric thickness) over each of the epitaxial layers 312 as a function of the distance TY. As discussed, the IL 402 and the high-K gate dielectric layer 502 collectively define a gate dielectric of the gate structure for the device 300, therefore the total gate dielectric thickness of the device 300 may be defined as the sum of a thickness 'T1' of the IL 402 and a thickness 'T2', 'T3', or 'T4' of the high-K gate dielectric layer 502. Since, for the present example, it is assumed that the IL 402 is not subject to the shadowing effect, the thickness 'T1' of the IL 402 over each of the topmost, middle, and bottommost epitaxial layers 312 may be substantially the same. Thus, the differences in total gate dielectric thickness over each of the topmost, middle, and bottommost epitaxial layers 312 may be due to the variation in the thickness of the high-K gate dielectric layer 502 (e.g., 'T2' vs. 'T3' vs. 'T4').

Figure 7:
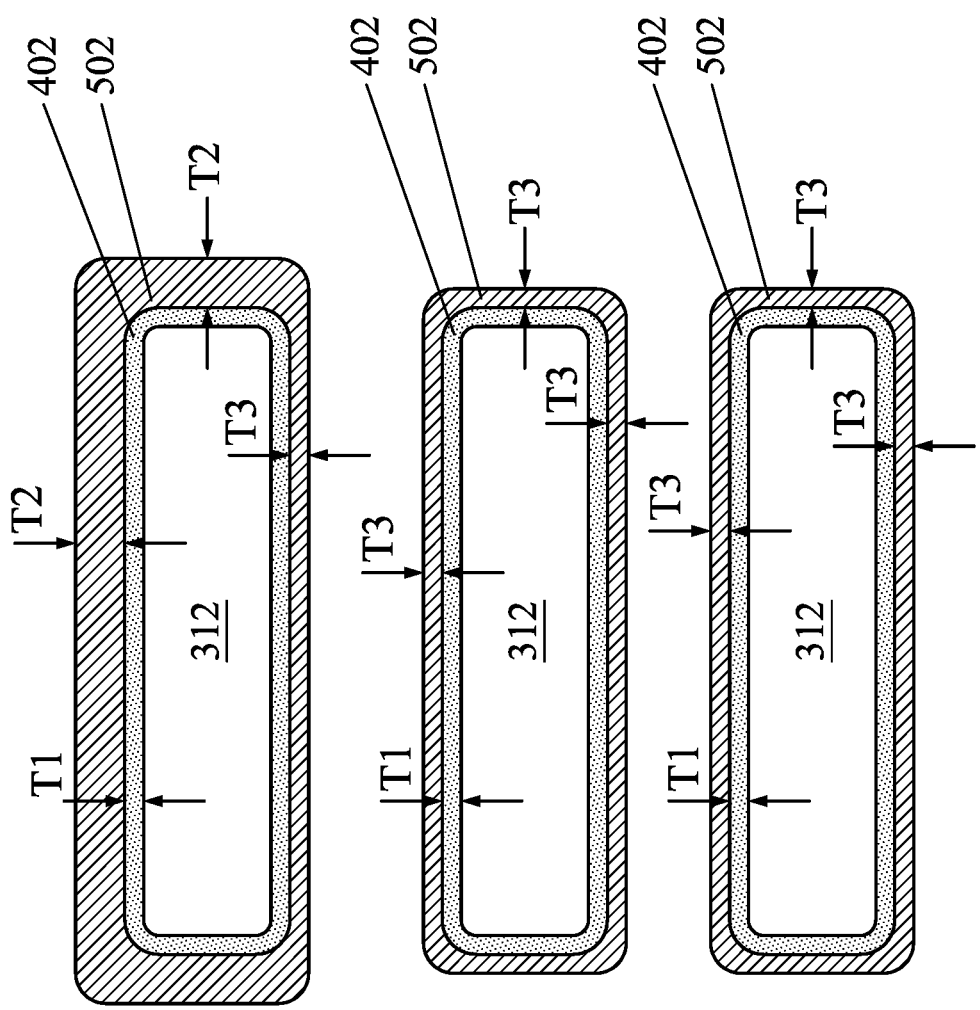
FIGS. 7, 8, 9, and 10 provide zoomed-in views of topmost, middle, and bottommost epitaxial layers 312 of a fin 304 of FIG. 5, in accordance with some embodiments.

For the example of FIG. 7, the distance TY may be between about 10-15 nm, and the shadowing effect may have a larger magnitude as compared to embodiments with a larger distance TY. As shown, the total gate dielectric thickness on top and lateral surfaces of the topmost epitaxial layer 312 ('T1'+'T2') is thicker than the total gate dielectric thickness on the bottom surface of the topmost epitaxial layer 312 ('T1'+'T3'). In some embodiments, the total gate dielectric thickness formed on top and lateral surfaces of the topmost epitaxial layer 312 ('T1'+'T2') is between about 2.7-3 nm, and the total gate dielectric thickness formed on the bottom surface of the topmost epitaxial layer 312 ('T1'+'T3') has a thickness of between about 2-2.5 nm. In a furtherance of this example, the total gate dielectric thickness formed on top, bottom, and lateral surfaces of the middle epitaxial layer 312 ('T1'+'T3') and the bottommost epitaxial layer 312 ('T1'+'T3') may be substantially equal (uniform). By way of example, the total gate dielectric thickness formed on the top, bottom, and lateral surfaces of the middle epitaxial layer 312 ('T1'+'T3') and the bottommost epitaxial layer 312 ('T1'+'T3') may have a thickness of between about 2-2.5 nm, which is substantially the same as the thickness of the gate dielectric formed on the bottom surface of the topmost epitaxial layer 312 ('T1'+'T3').

Figure 8:
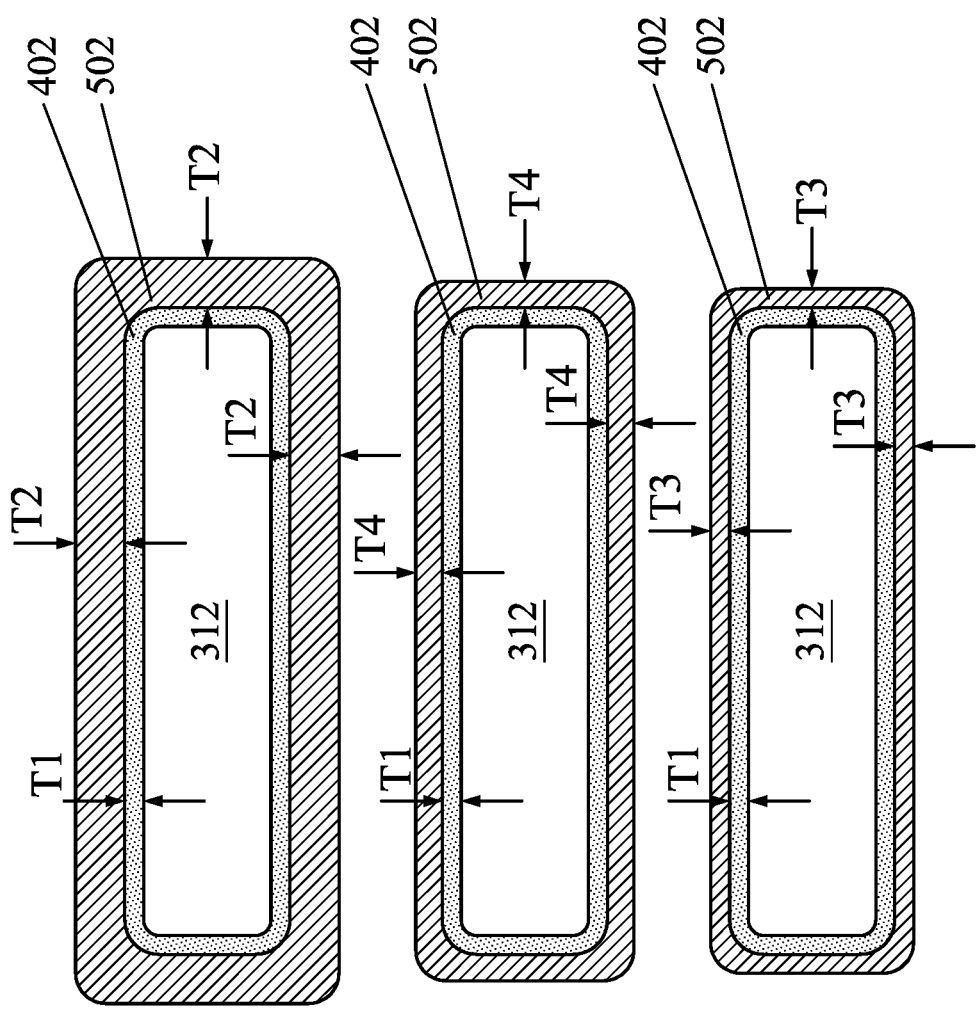

For the example of FIG. 8, the distance 'D' may be between about 15-20 nm, and the shadowing effect may have a smaller magnitude as compared to embodiments with a smaller distance 'D' (e.g., such as the example of FIG. 7). As shown, the total gate dielectric thickness formed on top, bottom, and lateral surfaces of the topmost epitaxial layer 312 ('T1'+'T2') is substantially equal (uniform), the total gate dielectric thickness formed on top, bottom, and lateral surfaces of the middle epitaxial layer 312 ('T1'+'T4') is substantially equal (uniform), and the total gate dielectric thickness formed on top, bottom, and lateral surfaces of the bottommost epitaxial layer 312 ('T1'+'T3') is substantially equal (uniform). However, while the total gate dielectric thickness may be substantially uniform for a given semiconductor channel layer (epitaxial layer 312), the total gate dielectric thickness among the different semiconductor channel layers is different. For example, in some embodiments, the total thickness of the gate dielectric on the topmost epitaxial layer 312 ('T1'+'T2') may be greater than the total thickness of the gate dielectric on the middle epitaxial layer 312 ('T1'+'T4'), and the total thickness of the gate dielectric on the middle epitaxial layer 312 ('T1'+'T4') may be greater than the total thickness of the gate dielectric on the bottommost epitaxial layer 312 ('T1'+'T3'). In some embodiments, the total gate dielectric thickness formed on top, bottom, and lateral surfaces of the topmost epitaxial layer 312 ('T1'+'T2') has a thickness of between about 2.7-3 nm, the total gate dielectric thickness formed on top, bottom, and lateral surfaces of the middle epitaxial layer 312 ('T1'+'T4') has a thickness of between about 2.2-2.7 nm, and the total gate dielectric thickness formed on top, bottom, and lateral surfaces of the bottommost epitaxial layer 312 ('T1'+'T3') has a thickness of between about 2-2.5 nm. In various embodiments, the total gate dielectric thickness of the gate dielectric formed on top, bottom, and/or lateral surfaces of the topmost epitaxial layer 312 ('T1'+'T2') may be at least 0.2 nm thicker than the total gate dielectric thickness formed on top, bottom, and/or lateral surfaces of other epitaxial layers 312 underlying the topmost epitaxial layer 312.

Figure 9:
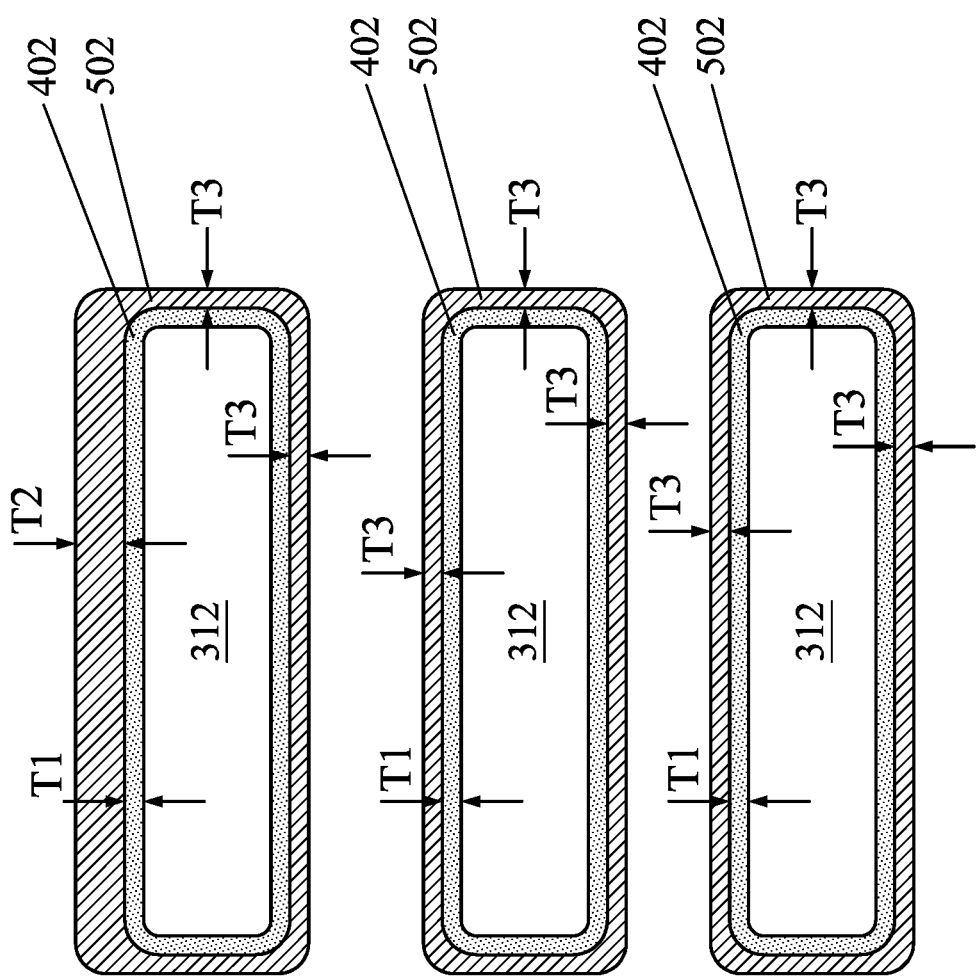

While FIGS. 7 and 8 provide some specific examples of the thickness of the high-K gate dielectric layer 502 (and more generally the total gate dielectric thickness) over each of the epitaxial layers 312 as a function of the distance 'D', these examples are not meant to be limiting, and other embodiments are possible and withing the scope of the present disclosure. For example, FIG. 9 illustrates an embodiment where the total gate dielectric thickness on the top surface of the topmost epitaxial layer 312 ('T1'+'T2') is increased, while the total gate dielectric thickness on the lateral surfaces of the topmost epitaxial layer 312 ('T1'+'T3') and on the bottom surface of the topmost epitaxial layer 312 ('T1'+'T3') are substantially equal (uniform) and less than the total gate dielectric thickness on the top surface of the topmost epitaxial layer 312 ('T1'+'T2'). Also, in the example of FIG. 9, the total gate dielectric thickness formed on top, bottom, and lateral surfaces of the middle epitaxial layer 312 ('T1'+'T3') and the bottommost epitaxial layer 312 ('T1'+'T3') may be substantially equal to each other and to the total gate dielectric thickness on the lateral and bottom surfaces of the topmost epitaxial layer 312 ('T1'+'T3'). It is noted that the values of the total gate dielectric thicknesses shown in FIG. 9 ('T1'+'T2' and 'T1'+'T3') may be substantially the same as described above. In some embodiments, the example of FIG. 9 may correspond to a case where the distance 'D' is less than about 10 nm, and where the shadowing effect has an even greater magnitude than the example of FIG. 7. It is further noted however, that decreasing the distance 'D' much less than 10 nm may result in incomplete deposition of the high-K gate dielectric layer 502 on one or more of lateral and bottom surfaces of the topmost epitaxial layer 312, top, bottom, and lateral surfaces of the middle epitaxial layer 312, and top, bottom, and lateral surfaces of the bottommost epitaxial layer 312.

Figure 10:
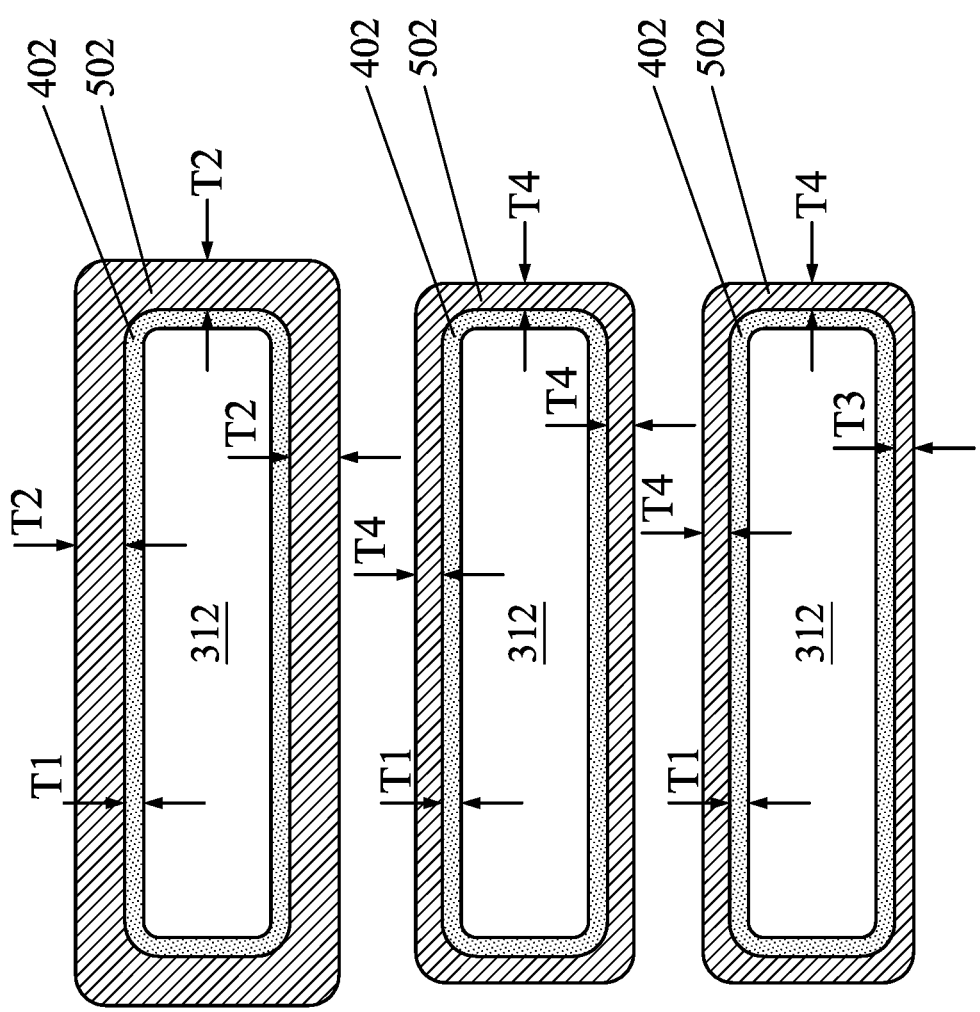

As another example, FIG. 10 illustrates an embodiment where the total gate dielectric thickness formed on top, bottom, and lateral surfaces of the topmost epitaxial layer 312 ('T1'+'T2') is substantially equal (uniform), the total gate dielectric thickness formed on top, bottom, and lateral surfaces of the middle epitaxial layer 312 ('T1'+'T4') is substantially equal (uniform), and the total gate dielectric thickness formed on top and lateral surfaces of the bottommost epitaxial layer 312 ('T1'+'T4') is substantially equal (uniform), while the total gate dielectric thickness formed on the bottom surface of the bottommost epitaxial layer 312 ('T1'+'T3') is less than the total gate dielectric thickness on top and lateral surfaces of the bottommost epitaxial layer 312 ('T1'+'T4'). Also, in the example of FIG. 10, the total thickness of the gate dielectric on the topmost epitaxial layer 312 ('T1'+'T2') is greater than the total thickness of the gate dielectric on the middle epitaxial layer 312 ('T1'+'T4'), and the total thickness of the gate dielectric on the middle epitaxial layer 312 ('T1'+'T4') is substantially equal to the total gate dielectric thickness formed on top and lateral surfaces of the bottommost epitaxial layer 312 ('T1'+'T4'), while also being greater than the total thickness of the gate dielectric on the bottom surface of bottommost epitaxial layer 312 ('T1'+'T3'). It is noted that the values of the total gate dielectric thicknesses shown in FIG. 10 ('T1'+'T2', 'T1'+'T3', and 'T1'+'T4') may be substantially the same as described above. In some embodiments, the example of FIG. 10 may correspond to a case where the distance 'D' is greater than about 20 nm, and where the shadowing effect has an even smaller magnitude than the example of FIG. 8. It is further noted however, that increasing the distance 'D' much more than 20 nm may result in complete loss of the shadowing effect, resulting in substantially uniform deposition of the high-K gate dielectric layer 502 over each of the top, bottom, and lateral surfaces of the topmost, middle, and bottommost epitaxial layers 312, thereby providing a substantially uniform total gate dielectric thickness over each of the epitaxial layers 312.

For avoidance of doubt, in some embodiments, more than one of the embodiments shown in the examples of FIGS. 7-10 may be formed on the substrate 302 at the same time. For instance, a first GAA transistor formed on the substrate 302 may be fabricated such that the distance 'D' is between about 10-15 nm, and a second GAA transistor formed on the substrate 302 may be fabricated such that the distance 'D' is between about 15-20 nm. Thus, in this example, the topmost, middle, and bottommost epitaxial layers 312 of the first GAA transistor would have total gate dielectric thicknesses substantially the same as provided in the example of FIG. 7. Moreover, in furtherance of this example, the topmost, middle, and bottommost epitaxial layers 312 of the second GAA transistor would have total gate dielectric thicknesses substantially the same as provided in the example of FIG. 8. Likewise, in some embodiments, other GAA transistors having other profiles of the total gate dielectric thickness (e.g., such as shown in FIGS. 9 and 10) may also be formed on the same substrate 302 as the first and second GAA transistor of this example.

After formation of the gate dielectric (block 204), the method 200 proceeds to block 206 where a metal gate layer is formed to complete the gate structure for the device 300. In at least some embodiments, after formation of the gate dielectric and prior to formation of the metal gate layer, an etching process and/or a clean process (e.g., a wet clean process) may be performed. However, because of the thicker total gate dielectric thickness deposited over at least the topmost epitaxial layer 312, the topmost epitaxial layer 312 is protected from any potential damage that may otherwise have been caused by the etching process and/or clean process, thereby preventing increased leakage current and degraded performance of the device 300. Whether or not the etching process and/or a clean process is performed, the thicker total gate dielectric thickness, formed at least on the topmost epitaxial layer 312, may serve to reduce AC delay by lowering the gate-to-channel capacitance (Cgc).

Figure 6:
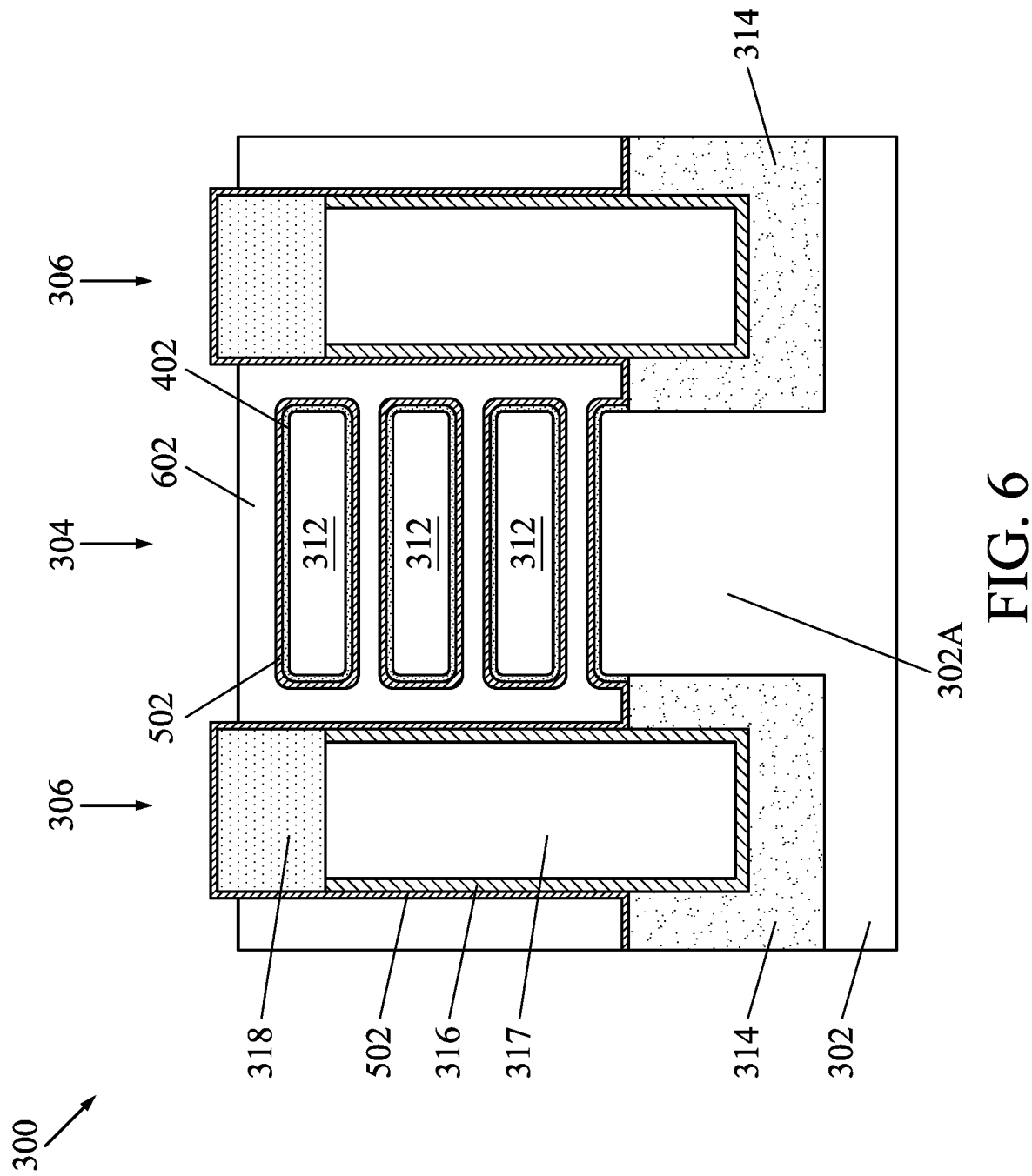

Referring to the example of FIGS. 5 and 6, in an embodiment of block 206, a metal gate including a metal layer 602 is formed over the high-K gate dielectric layer 502, including wrapping around (surrounding) the high-K gate dielectric layer 502 that is wrapped around the epitaxial layers 312. As shown, the metal layer 602 may be merged between adjacent epitaxial layers 312, and the metal layer 602 may contact sidewalls of the hybrid fins 306. In some embodiments, the metal layer 602 may include a metal, metal alloy, metal silicide, or combinations thereof. After deposition of the metal layer 602, a CMP process may be performed to remove excessive portions of the deposited metal layer and thereby planarize a top surface of the device 300. In some examples, after the CMP process, a recess process (e.g., including a wet or dry etching process) may be performed to recess a top surface of the metal layer 602 with respect to a top surface of the hybrid fins 306.

In some embodiments, the metal layer 602 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 602 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 602 may be formed by ALD, PVD, CVD, e-beam evaporation, or other suitable process. Further, the metal layer 602 may be formed separately for N-type and P-type transistors which may use different metal layers. In addition, the metal layer 602 may provide an N-type or P-type work function, may serve as a transistor (e.g., GAA or FINFET device) gate electrode, and in at least some embodiments, the metal layer 602 may include a polysilicon layer. With respect to the GAA device 300 shown and discussed, the gate structure includes portions that interpose each of the epitaxial layers 312, which each form channels of the GAA device 300.

The device 300 fabricated according to the method 200 may undergo further processing to form various features and regions known in the art. For example, subsequent processing may form various contacts/vias/lines and multilayer interconnect features (e.g., metal layers and interlayer dielectrics) on the substrate including the device 300, configured to connect the various features to form a functional circuit that may include one or more devices (e.g., one or more of the device 300). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Figure 11:
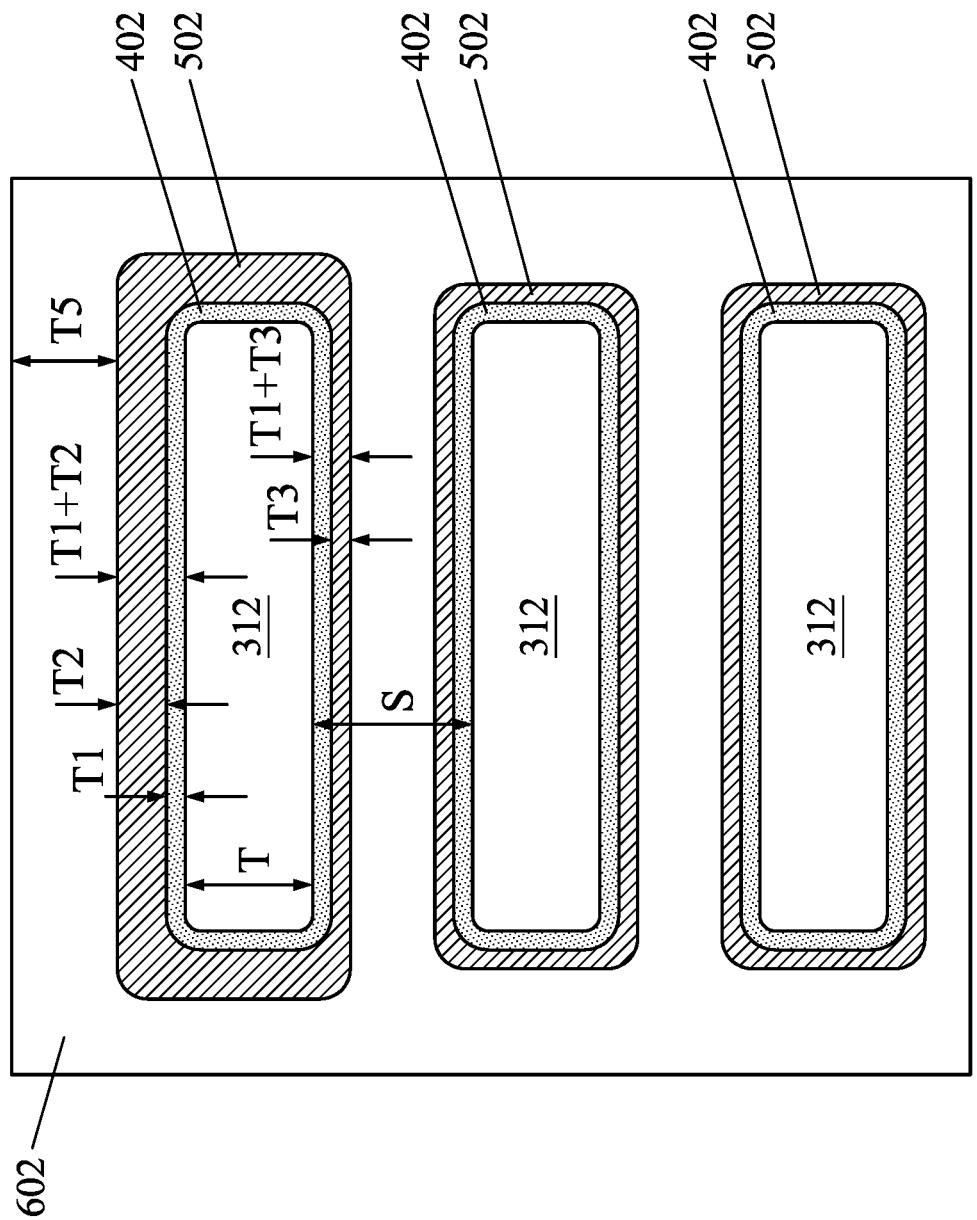
FIG. 11 provides a zoomed-in view of the topmost, middle, and bottommost epitaxial layers 312 of the fin 304 of FIG. 5 and including a metal gate layer, in accordance with some embodiments.

Elaborating on the above discussion, reference is made to FIG. 11, which provides a zoomed-in view of the topmost, middle, and bottommost epitaxial layers 312 of the fin 304 of FIG. 5, with total dielectric thicknesses for each of the epitaxial layers 312 substantially the same as that shown in FIG. 7 and including the metal layer 602. In particular, and in accordance with various embodiments, some general rules regarding the various dimensions identified in the example of FIG. 11 can be provided. The identified dimensions include the thickness 'T' of the epitaxial layers 312 (the semiconductor channel layers), the spacing 'S' between adjacent epitaxial layers 312, the total thickness of the gate dielectric along a top surface of the topmost epitaxial layer 312 ('T1'+'T2'), the total thickness of the gate dielectric along a bottom surface of the topmost epitaxial layer 312 ('T1'+'T3'), and a thickness 'T5' of the metal layer 602 disposed over the topmost epitaxial layer 312. For purposes of this discussion, the rule discussed regarding the total thickness of the gate dielectric along the bottom surface of the topmost epitaxial layer 312 ('T1'+'T3') may be generally applied to any surface (top, bottom, and lateral surfaces) of any epitaxial layer 312, except for the top surface of the topmost epitaxial layer 312. Thus, as a first rule, the total thickness of the gate dielectric along the bottom surface of the topmost epitaxial layer 312, and more generally the total thickness of the gate dielectric on any surface of any epitaxial layer 312 (except the top surface of the topmost epitaxial layer 312) may be greater than or equal to about 2 nm. As another rule, the total thickness of the gate dielectric along a top surface of the topmost epitaxial layer 312 may be greater than or equal to about 2.7 nm due to the increased potential for etch/clean damage, as discussed above. In addition, the total thickness of the gate dielectric along the top surface of the topmost epitaxial layer 312 may be less than or equal to about 70% of the thickness 'T' of the epitaxial layers 312. As a further rule, the spacing 'S' between adjacent epitaxial layers 312 may be less than or equal to about 4 times the thickness 'T' of the epitaxial layers 312, and greater than or equal to about 2 times the thickness 'T' of the epitaxial layers 312 in order to accommodate the total thickness of the gate dielectric (IL 402 and high-K gate dielectric layer 502) and the metal layer 602 of the metal gate. As yet another rule, the thickness 'T5' of the metal layer 602 disposed over the topmost epitaxial layer 312 may be less than or equal to about 4 times the thickness 'T' of the epitaxial layers 312 and larger than or equal to about 1.5 times the thickness 'T' of the epitaxial layers 312. While the above rules have been discussed with reference to an embodiment having total dielectric thicknesses for each of the epitaxial layers 312 substantially the same as that shown in FIG. 7, it will be understood that these rules may be equally applied to other embodiments having different dielectric thicknesses disposed over the epitaxial layers 312, such as shown in the examples of FIGS. 8-10 or as may be fabricated in other embodiments not explicitly shown.

The various embodiments described herein offer several advantages over the existing art. It will be understood that not all advantages have been necessarily discussed herein, no particular advantage is required for all embodiments, and other embodiments may offer different advantages. For example, embodiments discussed herein include gate structures for multi-gate devices and methods of forming such gate structures, where the gate dielectric formed over the topmost semiconductor channel layer of the plurality of channel layers is thicker than the gate dielectric formed over one or more other semiconductor channel layers disposed beneath the topmost semiconductor channel layer. Generally, the thicker gate dielectric (e.g., IL and high-K gate layer) may be deposited to provide a thicker total gate dielectric thickness along a top surface, a lateral/side surface, a bottom surface, or a combination thereof, of the topmost semiconductor channel layer and optionally over at least one semiconductor channel layer disposed beneath the topmost semiconductor channel layer. In various embodiments, deposition of the thicker gate dielectric over the topmost semiconductor channel layer can protect the topmost semiconductor channel layer from potential damage due to a subsequent etching process and/or clean process, thereby preventing increased leakage current and degraded device performance. In some embodiments, the thicker gate dielectric on the topmost semiconductor channel layer may also serve to reduce AC delay by reducing Cgc. Further, the thicker gate dielectric on the topmost semiconductor channel layer may be deposited without added process complexity. Other embodiments and advantages will be evident to those skilled in the art upon reading the present disclosure.

Thus, one of the embodiments of the present disclosure described a semiconductor device including a fin extending from a substrate. In some embodiments, the fin includes a plurality of semiconductor channel layers. In some examples, the semiconductor device further includes a gate dielectric surrounding each of the plurality of semiconductor channel layers. In some embodiments, a first thickness of the gate dielectric disposed on a top surface of a topmost semiconductor channel layer of the plurality of semiconductor channel layers is greater than a second thickness of the gate dielectric disposed on a surface of another semiconductor channel layer disposed beneath the topmost semiconductor channel layer.

In another of the embodiments, discussed is a semiconductor device that includes a fin element including a plurality of epitaxial layers. In some embodiments, the semiconductor device further includes a hybrid fin disposed adjacent to the fin element. In some examples, each of the plurality of epitaxial layers is spaced a distance from the hybrid fin. In some cases, the semiconductor device further includes a gate dielectric layer wrapping around each of the plurality of epitaxial layers in a channel region of the semiconductor device. In some embodiments, a first thickness of the gate dielectric layer disposed on a first surface of a topmost epitaxial layer of the plurality of epitaxial layers is greater than a second thickness of the gate dielectric layer disposed on a second surface of at least one epitaxial layer of the plurality of epitaxial layers disposed beneath the topmost epitaxial layer.

In yet another of the embodiments, discussed is a method of fabricating a semiconductor device including forming a fin having a plurality of semiconductor channel layers, and forming a hybrid fin disposed adjacent to the fin. In some embodiments, the hybrid fin is separated from lateral ends of the semiconductor channel layers by a distance 'D'. In some examples, the method further includes depositing a gate dielectric layer wrapping around each of the plurality of semiconductor channel layers. In some cases, the distance 'D' causes a shadowing effect to occur during the deposition of the gate dielectric layer. In some embodiments, the shadowing effect causes a first thickness of the gate dielectric layer disposed on a first surface of a topmost semiconductor channel layer of the plurality of semiconductor channel layers to be greater than a second thickness of the gate dielectric layer disposed on a second surface of at least one semiconductor channel layer disposed beneath the topmost semiconductor channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin extending from a substrate, wherein the fin includes a plurality of semiconductor channel layers; and
a gate dielectric surrounding each of the plurality of semiconductor channel layers;
wherein a first thickness of the gate dielectric disposed on a top surface of a topmost semiconductor channel layer of the plurality of semiconductor channel layers is greater than a second thickness of the gate dielectric disposed on a surface of another semiconductor channel layer disposed beneath the topmost semiconductor channel layer.

2. The semiconductor device of claim 1, wherein the first thickness of the gate dielectric disposed on the top surface of the topmost semiconductor channel layer is equal to a third thickness of the gate dielectric disposed on a lateral surface of the topmost semiconductor channel layer.

3. The semiconductor device of claim 1, wherein the first thickness of the gate dielectric disposed on the top surface of the topmost semiconductor channel layer is equal to a third thickness of the gate dielectric disposed on lateral and bottom surfaces of the topmost semiconductor channel layer.

4. The semiconductor device of claim 1, wherein the second thickness of the gate dielectric disposed on the surface of the another semiconductor channel layer is greater than a third thickness of the gate dielectric disposed on another surface of a bottommost semiconductor channel layer of the plurality of semiconductor channel layers.

5. The semiconductor device of claim 4, wherein the another semiconductor channel layer includes a middle semiconductor channel layer that interposes the topmost semiconductor channel layer and the bottommost semiconductor channel layer.

6. The semiconductor device of claim 1, wherein the gate dielectric includes an interfacial layer and a high-K gate dielectric layer disposed over the interfacial layer.

7. The semiconductor device of claim 6, wherein a third thickness of the interfacial layer surrounding each of the plurality of semiconductor channel layers is substantially the same.

8. The semiconductor device of claim 6, wherein a third thickness of the high-K gate dielectric layer disposed over the top surface of the topmost semiconductor channel layer of the plurality of semiconductor channel layers is greater than a fourth thickness of the high-K gate dielectric layer disposed over the surface of the another semiconductor channel layer disposed beneath the topmost semiconductor channel layer.

9. The semiconductor device of claim 1, further comprising a hybrid fin disposed adjacent to the fin.

10. The semiconductor device of claim 9, wherein a distance between lateral ends of the plurality of semiconductor channel layers and the hybrid fin is less than or equal to 20 nm.

11. A semiconductor device, comprising:
a fin element including a plurality of epitaxial layers;
a hybrid fin disposed adjacent to the fin element, wherein each of the plurality of epitaxial layers is spaced a distance from the hybrid fin; and
a gate dielectric layer wrapping around each of the plurality of epitaxial layers in a channel region of the semiconductor device;
wherein a first thickness of the gate dielectric layer disposed on a first surface of a topmost epitaxial layer of the plurality of epitaxial layers is greater than a second thickness of the gate dielectric layer disposed on a second surface of at least one epitaxial layer of the plurality of epitaxial layers disposed beneath the topmost epitaxial layer.

12. The semiconductor device of claim 11, wherein the first surface includes a top surface of the topmost epitaxial layer.

13. The semiconductor device of claim 11, wherein a third thickness of the gate dielectric layer disposed on a third surface of the topmost epitaxial layer is equal to the first thickness of the gate dielectric layer disposed on the first surface of the topmost epitaxial layer.

14. The semiconductor device of claim 13, wherein the third surface includes a lateral surface of the topmost epitaxial layer or a bottom surface of the topmost epitaxial layer.

15. The semiconductor device of claim 11, wherein the second thickness of the gate dielectric layer disposed on the second surface of the at least one epitaxial layer disposed beneath the topmost epitaxial layer is greater than a third thickness of the gate dielectric layer disposed on a third surface of a bottommost epitaxial layer of the plurality of epitaxial layers.

16. The semiconductor device of claim 15, wherein the at least one epitaxial layer disposed beneath the topmost epitaxial layer includes a middle epitaxial layer that interposes the topmost epitaxial layer and the bottommost epitaxial layer.

17. The semiconductor device of claim 11, wherein the distance that each of the plurality of epitaxial layers is spaced from the hybrid fin is less than or equal to 20 nm.

18. A method of fabricating a semiconductor device, comprising:
forming a fin including a plurality of semiconductor channel layers;
forming a hybrid fin disposed adjacent to the fin, wherein the hybrid fin is separated from lateral ends of the semiconductor channel layers by a distance 'D'; and
depositing a gate dielectric layer wrapping around each of the plurality of semiconductor channel layers, wherein the distance 'D' causes a shadowing effect to occur during the deposition of the gate dielectric layer;
wherein the shadowing effect causes a first thickness of the gate dielectric layer disposed on a first surface of a topmost semiconductor channel layer of the plurality of semiconductor channel layers to be greater than a second thickness of the gate dielectric layer disposed on a second surface of at least one semiconductor channel layer disposed beneath the topmost semiconductor channel layer.

19. The method of claim 18, wherein the shadowing effect causes the second thickness of the gate dielectric layer disposed on the second surface of the at least one semiconductor channel layer to be greater than a third thickness of the gate dielectric layer disposed on a third surface of a bottommost semiconductor channel layer of the plurality of semiconductor channel layers.

20. The method of claim 18, further comprising forming a metal gate layer over the gate dielectric layer to provide a gate structure for the semiconductor device.

* * * * *